United States Patent
Uhm et al.

(10) Patent No.: US 12,120,853 B2
(45) Date of Patent: Oct. 15, 2024

(54) ELECTRONIC DEVICE INCLUDING HEAT DISSIPATION STRUCTURE

(71) Applicant: Samsung Electronics Co., Ltd., Gyeonggi-do (KR)

(72) Inventors: Junwhon Uhm, Gyeonggi-do (KR); Hyunmo Yang, Gyeonggi-do (KR); Sungkwang Yang, Gyeonggi-do (KR); Jongmin Yoon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 264 days.

(21) Appl. No.: 17/892,264

(22) Filed: Aug. 22, 2022

(65) Prior Publication Data

US 2022/0400575 A1    Dec. 15, 2022

Related U.S. Application Data

(63) Continuation of application No. PCT/KR2021/019859, filed on Dec. 24, 2021.

(30) Foreign Application Priority Data

Dec. 24, 2020  (KR) .......................... 10-2020-0183457

(51) Int. Cl.
*H05K 7/20* (2006.01)
*H05K 1/02* (2006.01)

(52) U.S. Cl.
CPC ........... *H05K 7/205* (2013.01); *H05K 1/0207* (2013.01); *H05K 7/20009* (2013.01); *H05K 7/20445* (2013.01); *H05K 1/0216* (2013.01)

(58) Field of Classification Search
CPC .. H05K 1/0207; H05K 1/0216; H05K 1/0243; H05K 1/0272; H05K 1/0298;
(Continued)

(56) References Cited

U.S. PATENT DOCUMENTS

| 6,618,267 | B1 | 9/2003 | Dalal et al. |
| 9,136,293 | B2 | 9/2015 | Yee et al. |

(Continued)

FOREIGN PATENT DOCUMENTS

| CN | 206671684 U | 11/2017 |
| JP | 2016-116182 A | 6/2016 |

(Continued)

OTHER PUBLICATIONS

Extended European Search Report dated Mar. 20, 2024.

*Primary Examiner* — Amir A Jalali
(74) *Attorney, Agent, or Firm* — Cha & Reiter, LLC

(57) ABSTRACT

According to an embodiment of the disclosure, a wearable electronic device may include a housing, a first printed circuit board (PCB), a second PCB disposed in parallel with the first PCB, a first interposer, and a second interposer, and the housing may include at least one first opening formed on a first portion, and the first interposer and the second interposer may be disposed between the first PCB and the second PCB, the first interposer and the second interposer may be disposed to have a first end of the first interposer and a second end of the second interposer facing the first end, spaced apart by a designated distance, and a first space between the first end and the second end may be connected to the at least one first opening of the housing. Various other embodiments are possible.

18 Claims, 15 Drawing Sheets

<When the second support housing is seen from the -x direction>

(58) Field of Classification Search
CPC .. H05K 1/116; H05K 1/14; H05K 1/144–145;
H05K 1/148; H05K 7/20009; H05K
7/20445; H05K 7/205; H05K 2201/042;
H05K 2201/093; H05K 2201/09427;
H05K 2201/09481; H05K 2201/10378;
G02B 27/0101; G02B 27/017; G02B
27/0172; G02B 27/0176; G02B
2027/0132; G02B 2027/0138; G02B
2027/014; G02B 2027/0178; G06F 3/012;
G06F 3/013; G06T 19/006

See application file for complete search history.

(56) References Cited

U.S. PATENT DOCUMENTS

| | | | |
|---|---|---|---|
| 9,626,899 | B2 | 4/2017 | Yajima et al. |
| 10,028,418 | B2 | 7/2018 | Nikkhoo et al. |
| 10,579,114 | B1 | 3/2020 | Mills |
| 10,674,607 | B2 | 6/2020 | Park et al. |
| 2019/0051615 | A1 | 2/2019 | Nair et al. |
| 2019/0082536 | A1 | 3/2019 | Park et al. |
| 2019/0319341 | A1* | 10/2019 | Park .............. H01Q 21/065 |
| 2019/0327834 | A1* | 10/2019 | Kim .............. H01Q 25/00 |
| 2020/0205289 | A1 | 6/2020 | Iida et al. |
| 2020/0337188 | A1* | 10/2020 | Yun .............. H05K 9/0032 |
| 2021/0144856 | A1* | 5/2021 | Park .............. H04M 1/0277 |
| 2021/0195736 | A1* | 6/2021 | Jeon .............. H05K 3/4697 |
| 2021/0212209 | A1* | 7/2021 | Kim .............. H05K 1/0215 |
| 2021/0251070 | A1* | 8/2021 | Noh .............. H05K 1/0224 |
| 2021/0392736 | A1* | 12/2021 | Koo .............. H05K 1/144 |
| 2022/0210957 | A1* | 6/2022 | Yun .............. H05K 9/0032 |
| 2022/0223538 | A1* | 7/2022 | Nam .............. H01L 23/552 |
| 2022/0256705 | A1 | 8/2022 | Ha et al. |
| 2022/0352120 | A1* | 11/2022 | Hong .............. H01L 23/5385 |
| 2022/0416409 | A1* | 12/2022 | Kim .............. H01Q 5/25 |
| 2023/0069694 | A1* | 3/2023 | Hong .............. H04M 1/02 |

FOREIGN PATENT DOCUMENTS

| | | |
|---|---|---|
| JP | 2019-36674 A | 3/2019 |
| KR | 10-2019-0029215 A | 3/2019 |
| KR | 10-2020-0032911 A | 3/2020 |
| KR | 10-2021-0007217 A | 1/2021 |
| KR | 10-2021-0144340 A | 11/2021 |
| KR | 10-2022-0004263 A | 1/2022 |
| KR | 10-2022-0068030 A | 5/2022 |
| KR | 10-2022-0068039 A | 5/2022 |
| WO | 2008059643 A1 | 5/2008 |
| WO | 2012/165598 A1 | 12/2012 |
| WO | 2020/171246 A1 | 8/2020 |

\* cited by examiner

<When the first support housing is seen from the +x direction>

<Perspective view of the first support housing>

<When the first support housing is seen from the -x direction>

ELECTRONIC DEVICE INCLUDING HEAT DISSIPATION STRUCTURE

CROSS-REFERENCE TO RELATED APPLICATION(S)

This application is a continuation of International Application No. PCT/KR2021/019859, filed on Dec. 24, 2021, which claims priority to Korean Patent Application No. 10-2020-0183457, filed on Dec. 24, 2020 in the Korean Intellectual Property Office, the disclosures of which are herein incorporated by reference.

TECHNICAL FIELD

One or more embodiments disclosed in the present document generally relate to an electronic device including a heat dissipation structure.

BACKGROUND

With the development of digital technology, electronic devices are provided in various forms like smartphones, tablet personal computers (PCs), wearable electronic devices. Recently, electronic devices are becoming smaller so as to enhance portability and accessibility of users.

While the sizes of the electronic devices are being miniaturized, functions of the electronic devices are becoming more diverse, and accordingly, there is a tradeoff in having enough internal space to dispose various electronic components (for example, processor, communication circuit, or memory) to perform various functions of the electronic devices while still miniaturizing the devices.

Recently, electronic devices having a layered structure with a plurality of printed circuit boards by using an interposer are increasingly used. The layered structure provides sufficient space for the electronic components disposed therein. For example, it is possible to secure a space where electronic components is disposed by stacking a plurality of printed circuit boards and disposing an interposer including at least one via for electrically connecting the printed circuit boards between the stacked printed circuit boards.

The electronic components disposed on the layered printed circuit boards may generate heat while operating, and accordingly, the temperature of the electronic device may increase. Due to the high temperature of the electronic device, performance of the electronic device may be degraded or the lifespan of individual electronic components and the electronic device may be reduced. In addition, due to the increased temperature, the temperature of the external surface of the electronic device may increase, causing user inconvenience because the high temperature may cause user discomfort.

When the layered structure of the printed circuit boards is formed by using an interposer, the space between the printed circuit boards may be enclosed by the interposer, and accordingly, it may be difficult to dissipate heat.

SUMMARY

According to an embodiment of the disclosure, a wearable electronic device may include a housing, a first printed circuit board (PCB), a second PCB disposed in parallel with the first PCB, a first interposer, and a second interposer, and the housing may include at least one first opening formed on a first portion thereof, and the first interposer and the second interposer may be disposed between the first PCB and the second PCB, the first interposer and the second interposer may be disposed to have a first end of the first interposer and a second end of the second interposer facing the first end, spaced apart by a designated distance, and a first space between the first end and the second end may be connected with the at least one first opening of the housing.

According to an embodiment, a wearable electronic device may include a first PCB, a second PCB disposed in parallel with the first PCB, a first interposer, and a second interposer, and the first interposer and the second interposer may be disposed between the first PCB and the second PCB, the first interposer and the second interposer may be disposed to have a first end of the first interposer and a second end of the second interposer facing the first end spaced apart by a first designated distance, and a third end of the first interposer may be disposed to be spaced apart from a fourth end of the second interposer facing the third end of the first interposer by a second designated distance.

According to certain embodiments disclosed in the present document, the wearable electronic device may effectively discharge heat generated in an electronic component by connecting the space between the first interposer and the second interposer to an opening of the housing.

In addition, according to certain embodiments, since the number of separable interposers manufactured per an area is larger than the number of integrated interposers, cost may be reduced.

Various other effects that may be directly or indirectly grasped through the present document may be provided.

DETAILED DESCRIPTION

Certain embodiments disclosed in the present document may discharge heat generated in an electronic component by connecting a space between a first interposer and a second interposer, which are separated from each other, to an opening included in a part of a housing.

Hereinafter, certain embodiments of the disclosure will be described with reference to the accompanying drawings. However, these do not limit the disclosure to a specific embodiment, and should be understood as including various modifications, equivalents, or alternatives of embodiments.

Figure 1:
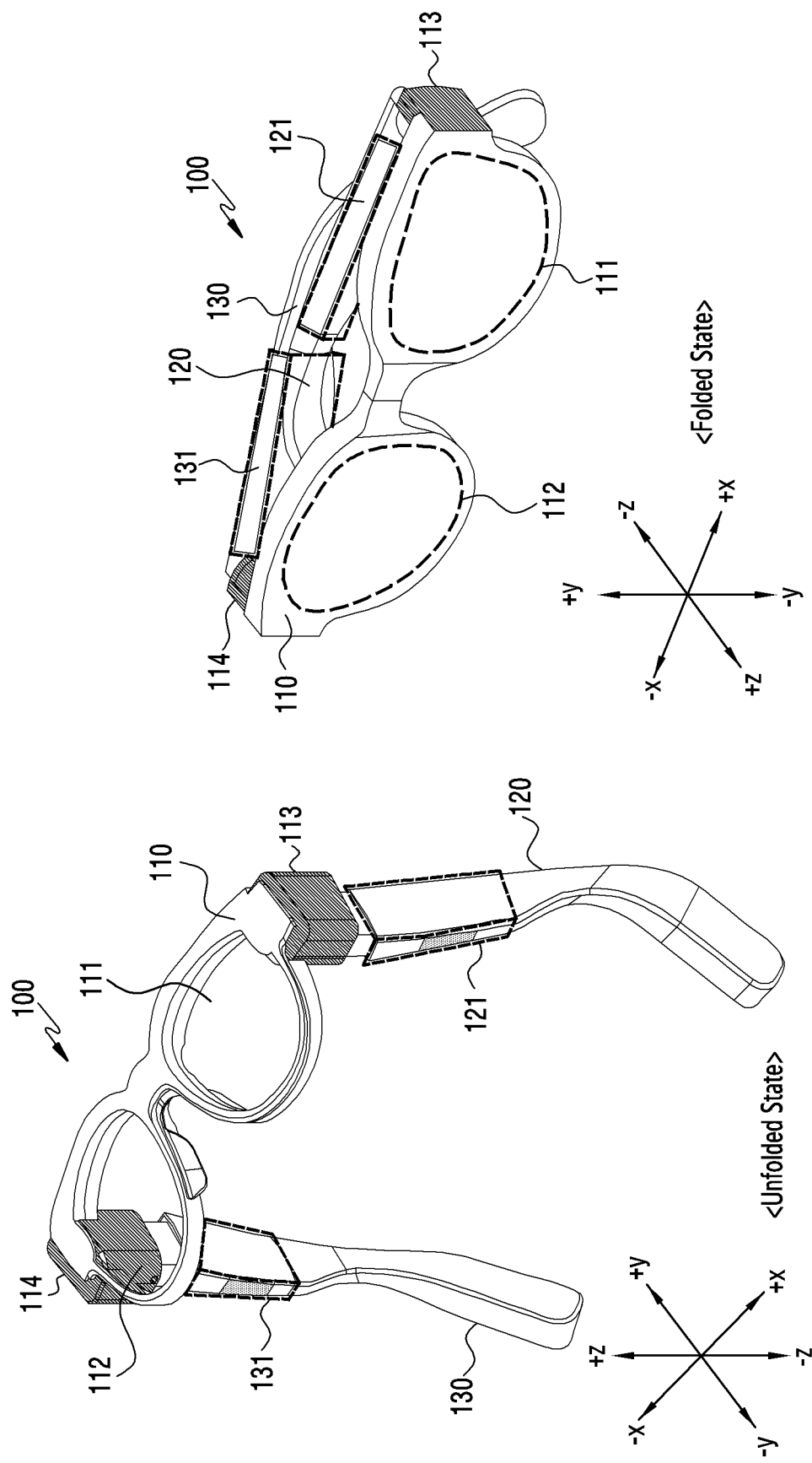
FIG. 1 is a view illustrating an unfolded state or a folded state of a wearable electronic device according to an embodiment.

FIG. 1 illustrates an unfolded state or a folded state of a wearable electronic device according to an embodiment.

Referring to FIG. 1, according to an embodiment, the wearable electronic device 100 may include a main housing 110, a first support housing 120 connected with the main housing 110 through a first connector 113, and a second support housing 130 connected with the main housing 110 through a second connector 114.

According to an embodiment, the main housing 110 may cover at least part of the user's face when the user wears the wearable electronic device 100.

According to an embodiment, a printed board assembly (PBA), which will be described below with reference to FIG. 2A, may be disposed inside a first portion 121 of the first support housing 120 and/or a second portion 131 of the second support housing 130.

According to an embodiment, the first connector 113 may physically connect the main housing 110 and the first support housing 120, and may be formed to allow the main housing 110 and the first support housing 120 to be rotatable within a designated range of angles (for example, +90 degrees to −90 degrees) with reference to the first connector 113. In an embodiment, the first connector 113 may be formed as a hinge structure to fix the main housing 110 and the first support housing 120, and may be formed to allow the main housing 110 and the first support housing 120 to be rotatable with reference to the first connector 113. The above explanation of the first connector 113 may be equally applied to the second connector 114 except for the rotation direction. For example, the second connector 114 may physically connect the main housing 110 and the second support housing 130, and may be formed to allow the main housing 110 and the second support housing 130 to be rotatable within a designated range of angles (for example, +90 degrees to −90 degrees) with reference to the second connector 114. In an embodiment, the second connector 114 may be formed as a hinge structure to fix the main housing 110 and the second support housing 130, and may be formed to allow the main housing 110 and the second support housing 130 to be rotatable with reference to the second connector 114.

According to an embodiment, a first display 111 for a left-eye image and/or a second display 112 for a right-eye image may be seated in the main housing 110. In an example, the first display 111 and the second display 112 may include any one of a near to eye display (NED) or a head mounted display (HMD). In another example, the first display 111 and the second display 112 may include a see-through display which is a kind of NED. For example, the wearable electronic device 100 may include a light waveguide formed on at least part thereof, and a certain area of the light waveguide may correspond to the see-through display. The see-through display may be positioned very close to user's eyes, and the user may wear the wearable electronic device 100 including the see-through display like eyewear. In another example, the wearable electronic device 100 may include a projector formed on at least part thereof to emit light and to display an object.

According to an embodiment, the wearable electronic device 100 may display an augmented reality (AR) image through the first display 111 and/or the second display 112. In an example, the first display 111 and/or the second display 112 may allow light of a real environment (or a real object) to pass therethrough, and, when the user wears the wearable electronic device 100, the user may recognize light of the real environment passing through the first display 111 and/or the second display 112.

According to another embodiment, the first display 111 and/or the second display 112 may be understood as a transparent display which is capable of allowing light of a real object to pass therethrough and is capable of displaying an image of a virtual object. For example, the wearable electronic device 100 may display an image of a virtual object through the first display 111 and/or the second display 112. The user may recognize a real object and a virtual object through the first display 111 and/or the second display 112 of the wearable electronic device 100, and accordingly, the wearable electronic device 100 may provide AR to the user.

According to an embodiment, the first display 111 and/or the second display 112 may include a transparent material such as glass or plastic.

The shape of the wearable electronic device 100 shown in FIG. 1 is merely an example, and the shape of the wearable electronic device 100 is not limited to that illustrated in FIG. 1. According to an embodiment, the wearable electronic device 100 may be a wearable electronic device 100 that is manufactured in such a shape that it is worn on user's head. For example, the wearable electronic device 100 may be configured in at least one shape of glass, goggles, helmet, or hat, but is not limited thereto.

Figure 2A:
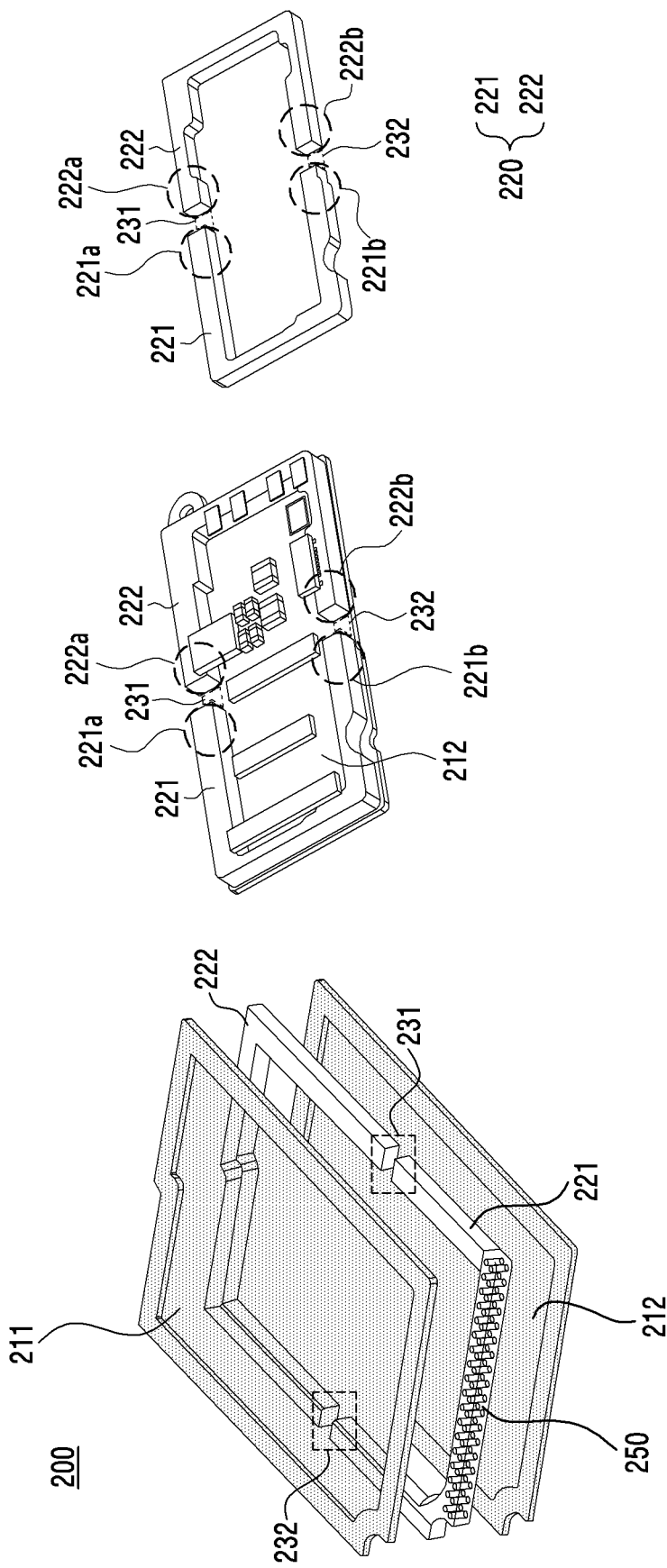
FIG. 2A is views illustrating a printed board assembly (PBA) disposed in a first support housing and/or a second support housing according to an embodiment.

FIG. 2A is views illustrating a PBA disposed in a first support housing and/or a second support housing according to an embodiment.

Referring to FIG. 2A, according to an embodiment, the printed board assembly (PBA) 200 may include a first printed circuit board (PCB) 211, a second PCB 212, and/or an interposer 220.

According to an embodiment, the PBA 200 may include the first PCB 211 and the second PCB 212 which is disposed substantially in parallel with the first PCB 211. According to an embodiment, the PBA 200 may include the interposer 220 disposed between the first PCB 211 and the second PCB 212, and the interposer 220 may enclose a space between the first PCB 211 and the second PCB 212.

According to an embodiment, the interposer 220 may include a first interposer 221 and a second interposer 222. In an embodiment, a first end 221a of the first interposer 221 may be disposed to be spaced apart from a second end 222a of the second interposer 222 by a designated distance (for example, 0.2 mm) or longer. In this case, a first space 231 between the first end 221a and the second 222a may be created to physically connect an inner space of the PBA 200 enclosed by the interposer 220 to the space outside of the PBA 200. In an embodiment, a third end 221b of the first interposer 221 may be disposed to be spaced apart from a fourth end 222b of the second interposer 222 by a designated distance (for example, 0.2 mm) or longer. In this case, a second space 232 between the third end 221b and the fourth end 222b may be created to physically connect the inner space of the PBA 200 enclosed by the interposer 220 to the space outside of the PBA 200. According to an embodiment, the first space 231 and the second space 232 may have substantially the same size and/or shape. According to another embodiment, the first space 231 and the second space 232 may have different sizes and/or shapes.

According to an embodiment, the first PCB 211 and the second PCB 212 may be coupled with each other through the interposer 220. For example, the first PCB 211 and the second PCB 212 may be coupled with each other through a plurality of conductive vias 250 included in the interposer 220. According to an embodiment, the first PCB 211 and the second PCB 212 may be electrically connected with each other through the plurality of conductive vias 250 included in the interposer 220, and/or side surface plating (for example, gold (Au)).

According to an embodiment, the first PCB 211 and the second PCB 212 may be fixed through the interposer 220. According to an embodiment, the first PCB 211 and the second PCB 212 may be coupled with the interposer 220, thereby forming a layered structure. According to an embodiment, at least one electronic component (for example, a processor, a memory, an interface) may be disposed on the first PCB 211 and/or the second PCB 212.

According to an embodiment, the interposer 220 may include two or more interposers. For example, when the interposer 220 includes three interposers, there are three spaces between the interposers, and, when the interposer 220 includes four interposers, there may be four spaces between the interposers.

Figure 2B:
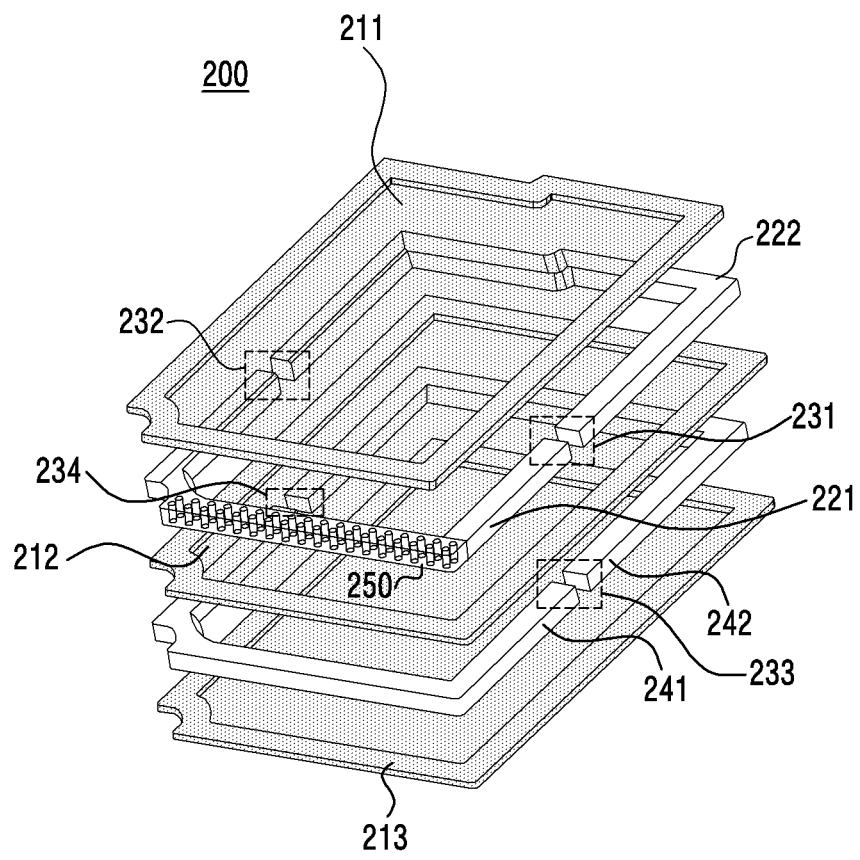
FIG. 2B is a view illustrating a third printed circuit board (PCB), a third interposer, and a fourth interposer which are added to the embodiment illustrated in FIG. 2A according to an embodiment.

FIG. 2B is a view illustrating a third PCB, a third interposer, and a fourth interposer which are added to the embodiment shown in FIG. 2A according to an embodiment.

Referring to FIG. 2B, according to an embodiment, the printed board assembly (PBA) 200 may further include the third PCB 213, the third interposer 241, and the fourth interposer 242.

According to an embodiment, the third interposer 241 and the fourth interposer 242 may be disposed between the second PCB 212 and the third PCB 213 to enclose some spaces between the second PCB 212 and the third PCB 213. In an embodiment, a fifth end of the third interposer 241 may be disposed to be spaced apart from a sixth end of the fourth interposer 242 by a designated distance (for example, 0.2 mm) or longer. In this case, a third space 233 between the fifth end and the sixth end may be created to physically connect the inner space of the PBA 200 to the space outside of the PBA 200. Substantially in the same way, a seventh end of the fourth interposer 242 may be disposed to be spaced apart from an eighth end of the fourth interposer 242 by a designated distance (for example, 0.2 mm) or longer, although they partially obscured in the drawing. In this case, a fourth space 234 between the seventh end and the eighth end may be created to physically connect the inner space of the PBA 200 to the space outside of the PBA 200.

According to an embodiment, the first space 231, the second space 232, the third space 233, and/or the fourth space 234 may be aligned with respect to a designated axis. For example, the first space 231 and the second space 232 may be aligned along the y-axis. In another example, the third space 233 and the fourth space 234 may be aligned along the y-axis. In still another example, the first space 231 and the third space 233 may be aligned along the x-axis, and the second space 232 and the fourth space 234 may be aligned along the x-axis. However, the first space 231, the second space 232, the third space 233 and/or the fourth space 234 being aligned along the designated axis is merely an example, and in another embodiment, the first space 231, the second space 232, the third space 233 and/or the fourth space 234 may be formed on various positions. For example, in another embodiment, the first space 231 and the second space 232 may be disposed not to be aligned along the y-axis.

Figure 3:
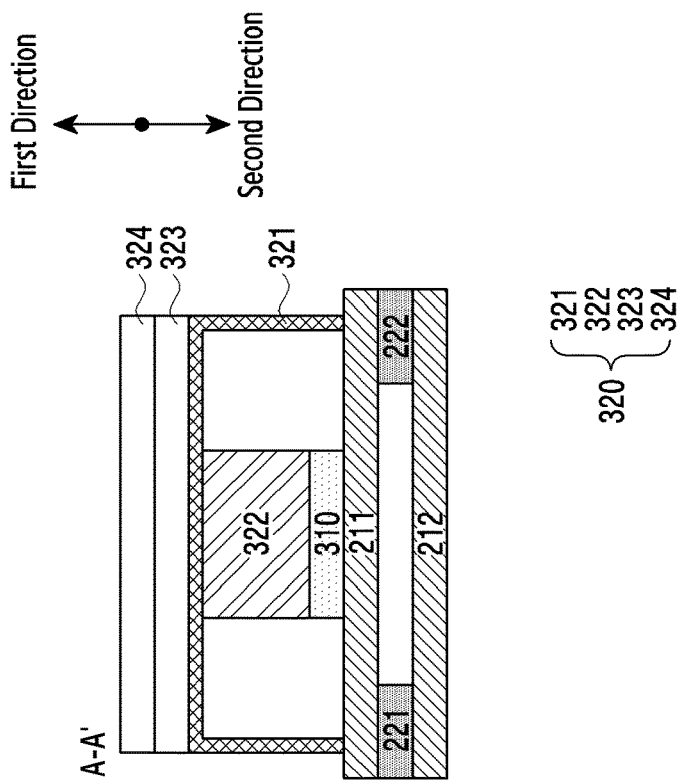
FIG. 3 is views illustrating a PBA to which an additional heat dissipation structure is coupled according to an embodiment.
Figure 3:
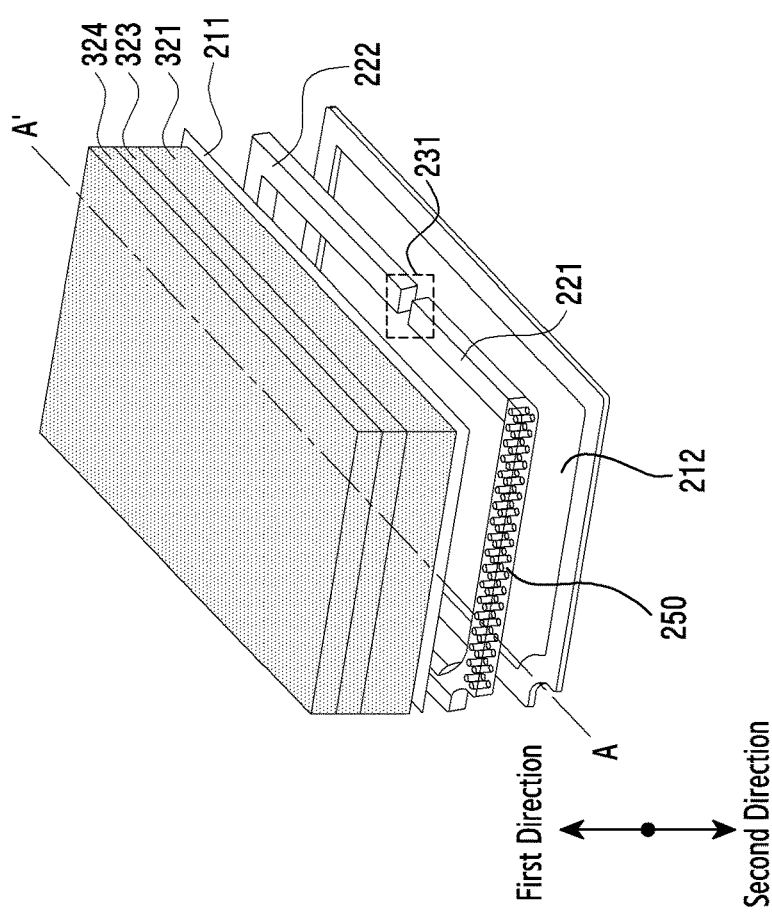

FIG. 3 is views illustrating a PBA to which an additional heat dissipation structure is coupled according to an embodiment.

In an embodiment, the wearable electronic device 100 may include an additional heat dissipation structure 320. In an embodiment, the additional heat dissipation structure 320 may include a shielding member 321, a thermal transfer member 322, a heat dissipation sheet 323 and/or a thermal spreader 324.

According to an embodiment, at least one electronic component 310 (for example, a processor, a wireless communication circuit) may be disposed on the first PCB 211. In an embodiment, the shielding member 321 may be disposed to enclose the electronic component 310. For example, the electronic component 310 may be disposed in the second direction as shown in FIG. 3 of the shielding member 321, and the shielding member 321 may be disposed along a circumference of the first PCB 211, and may enclose the electronic component 310. In an embodiment, the shielding member 321 may be referred to as a shield can. The shielding member 321 may have not only a heat dissipation function but also an electromagnetic interference shielding (EMI shielding) function.

According to an embodiment, the shielding member 321 may include metal having great thermal conductivity. For example, the shielding member 321 (for example, the shield can) may include at least one of copper (Cu), nickel (Ni), silver (Ag), gold (Au), and/or aluminum (Al).

According to an embodiment, the shielding member 321 may be a thermal conductive filler (for example, metal filler, ceramic filler, carbon filler), or a composite material such as polymer.

According to an embodiment, the heat dissipation sheet 323 may be disposed on the shielding member 321. For example, the heat dissipation sheet 323 may be disposed to be in contact with the shielding member 321 in the first direction as shown in FIG. 3 of the shielding member 321.

According to an embodiment, the heat dissipation sheet 323 may include an adhesive layer having adhesiveness, and the heat dissipation sheet 323 may be attached to at least part of the shielding member 321 through the adhesive layer. In an embodiment, the heat dissipation sheet 323 and the shielding member 321 may be bonded to each other by using an adhesive member (for example, conductive tape or conductive bond).

According to an embodiment, the thermal transfer member 322 may be disposed between the electronic component 310 and the shielding member 321. In an embodiment, the thermal transfer member 322 may be made of a solid material or a liquid material having high thermal conductivity. For example, the thermal transfer member 322 may be a carbon polymer and/or a ceramic material having high thermal conductivity. In an embodiment, the thermal transfer member 322 may be disposed between the electronic component 310 and the shielding member 321 to strengthen thermal coupling, and through this, may efficiently transmit heat generated by the electronic component 310 to the shielding member 321. According to an embodiment, the thermal transfer member 322 may have substantially the same size as the electronic component 310. For example, a surface of the thermal transfer member 322 that contacts the electronic component 310 may be substantially the same as a surface of the electronic component 310 that contacts the thermal transfer member 322. According to an embodiment, the shape of the thermal transfer member 322 is not limited to the illustrated shape (for example, a rectangle), and may have various shapes and sizes.

According to an embodiment, the thermal spreader 324 may be disposed on the heat dissipation sheet 323. For example, the thermal spreader 324 may be disposed to be in contact with the heat dissipation sheet 323 in the first direction of the heat dissipation sheet 323. In an embodiment, the thermal spreader 324 may include material having high thermal conductivity. For example, the thermal spreader 324 may be configured by using at least one of copper (Cu) or aluminum (Al). In an embodiment, the thermal spreader 324 may include a metal water cooling device (for example, a heat pipe, a vapor chamber) and/or a heat dissipation plate. The thermal spreader 324 may absorb heat transmitted from the heat dissipation sheet 323 and may discharge heat by spreading it outwardly.

Figure 4:
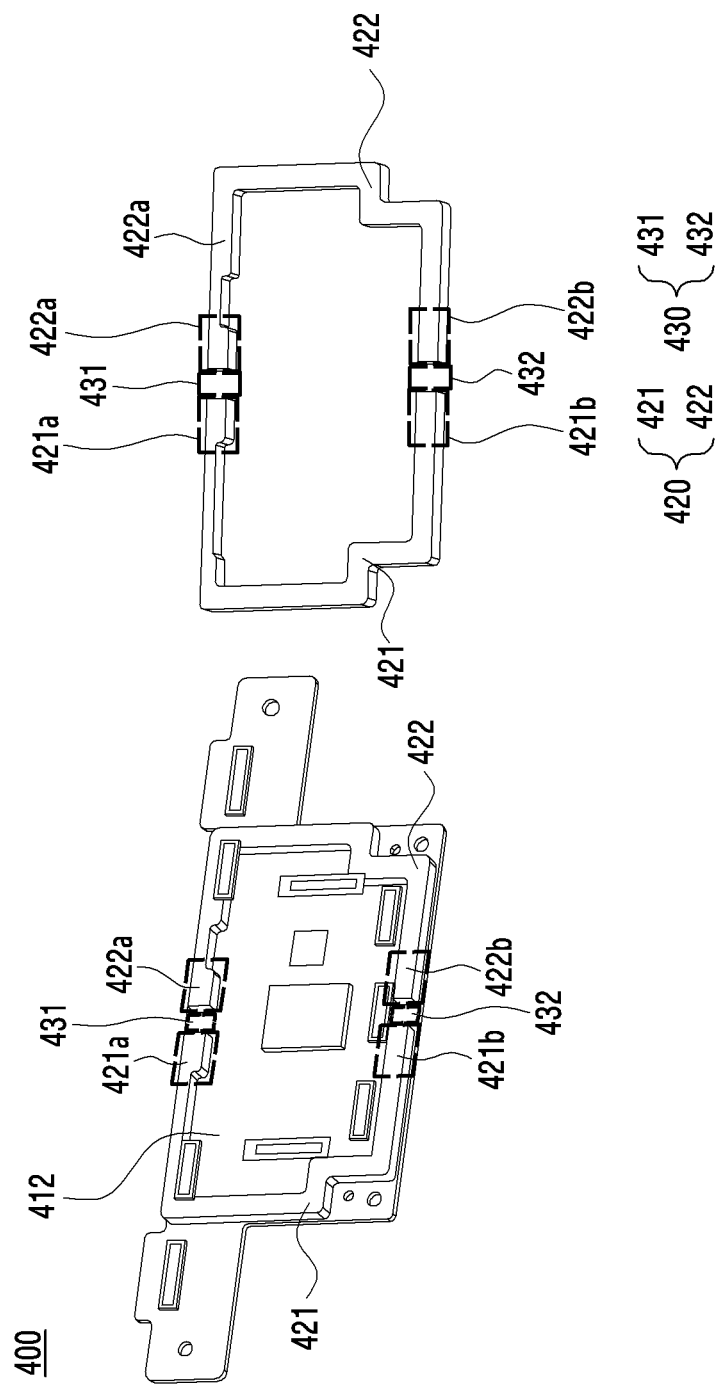
FIG. 4 is views illustrating a PBA which is disposed in a first support housing and/or a second support housing according to another embodiment.

FIG. 4 is views illustrating a PBA which is disposed in a first support housing and/or a second support housing according to another embodiment.

Referring to FIG. 4, according to an embodiment, the printed board assembly (PBA) 400 may include a first PCB (not shown), a second PCB 412, and/or an interposer 420. In an embodiment, the first PCB and the second PCB of the PBA 400 may correspond to the first PCB 211 and the second PCB 212 shown in FIG. 2A, respectively.

According to an embodiment, the PBA 400 may include the first PCB and the second PCB 412 which is disposed substantially in parallel with the first PCB. According to an embodiment, the PBA 400 may include the interposer 420 disposed between the first PCB and the second PCB 412, and the interposer 420 may enclose at least part of the space between the first PCB and the second PCB 412.

According to an embodiment, the interposer 420 may include a first interposer 421 and a second interposer 422. In an embodiment, a first end 421a of the first interposer 421 may be disposed to be spaced apart from a second end 422a of the second interposer 422 by a designated distance (for example, 0.2 mm) or longer. According to an embodiment, the first interposer 421, the second interposer 422, the first PCB and the second PCB 412 may be coupled with one another to form a space 430 (for example, first space 431 and second space 432) between the first end 421a and the second end 422a and between a third end 421b and a fourth end 422b. In this case, the first space 431 between the first end 421a and the second end 422a may physically connect the inside of the PBA 4100 that is enclosed by the interposer 420 to the space outside of the PBA 400. In an embodiment, the third end 421b of the first interposer 421 may be disposed to be spaced apart from the fourth end 422b of the second interposer 422 by a designated distance (for example, 0.2 mm) or longer. In this case, the second space 432 between the third end 421b and the fourth end 422b may physically connect the inside of the PBA 400 that is enclosed by the interposer 420 to the space outside of the PBA 400.

Figure 5A:
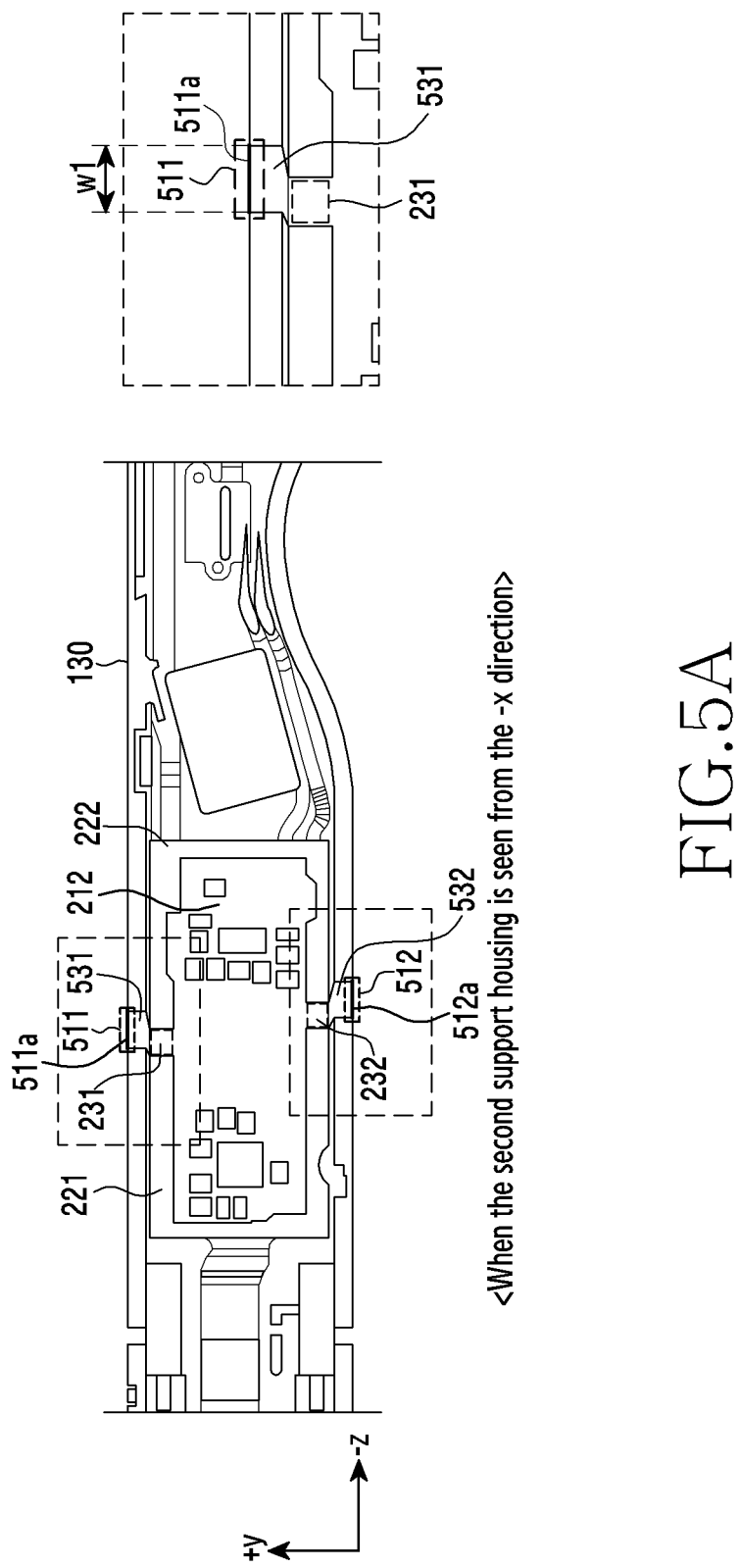
FIG. 5A is a view illustrating a heat dissipation structure that dissipates heat through a space between a first interposer and a second interposer which are spaced apart from each other, and an opening of a second support housing.

FIG. 5A is a view illustrating a heat dissipation structure that dissipates heat through a space between a first interposer and a second interposer which are spaced apart from each other, and an opening of a second support housing according to an embodiment.

Figure 5B:
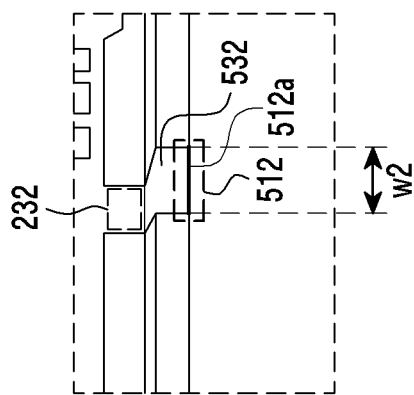
FIG. 5B is a view illustrating the second support housing seen from the −y direction.
Figure 5B:
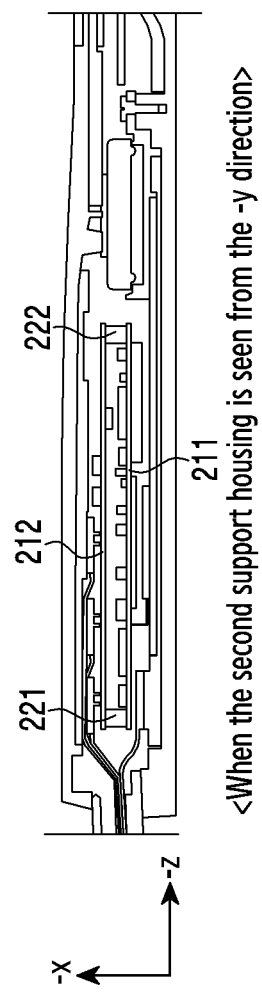

FIG. 5B is a view illustrating the second support housing seen from the −y direction.

Figure 5C:
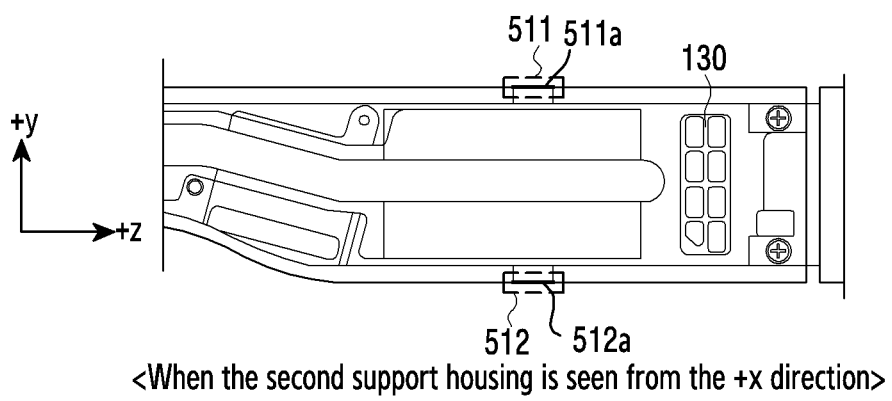
FIG. 5C is a view illustrating the second support housing seen from the +x direction.

FIG. 5C is a view illustrating the second support housing seen from the +y direction.

Referring to FIG. 5A, FIG. 5B, and FIG. 5C, According to an embodiment, the second support housing 130 may include a first opening 511 disposed on a portion adjacent to the first space 231 within a specific distance, and the second support housing 130 may include a second opening 512 disposed on a portion adjacent to the second space 232 within a specific distance. In an embodiment, the first opening 511 may have a first width W1, and the second opening 512 may have a second width W2. For example, the first width W1 and the second width W2 may be the same as each other. In an embodiment, the first width W1 of the first opening 511 may be equal to or larger than the width of the first space 231 between the first end 221a and the second end 222a. In an embodiment, the second width W2 of the second opening 512 may be equal to or larger than the width of the second space 232 between the third end 221b and the fourth end 222b.

In an embodiment, the first opening 511 and/or the second opening 512 may be filled with a porous material. For example, a first film 511a made of a porous material may be disposed in the first opening 511. In another example, a second film 512a made of a porous material may be disposed in the second opening 512. In an embodiment, the first film 511a and/or the second film 512a made of the porous material may allow air to pass through, and may implement waterproofing and/or a dustproofing by preventing water or dust from entering the wearable electronic device 100 from the outside.

According to an embodiment, the first space 231 may be connected (i.e. in fluidic communication) with the first opening 511 through a first connection duct 531. The second space 232 may be connected with the second opening 512 through a second connection duct 532. In an embodiment, heat generated by a plurality of electronic components (for example, the electronic component 310 of FIG. 3) disposed on the second PCB 212 may be transmitted to the outside through the first opening 511 and/or the second opening 512. For example, air in the interposer 220 that has a relatively high temperature due to heat may be discharged to the outside of the wearable electronic device 100 through the first space 231 and the first opening 511. In this case, air of the wearable electronic device 100 that has a relatively low temperature may flow into the interposer 220 through the second space 232 and the second opening 512. Accordingly, the wearable electronic device 100 may efficiently transmit internal heat to the outside of the wearable electronic device 100. Although it is illustrated in FIG. 5A that external cold air flows into the PBA 200 through the second space 232 and the second connection duct 532, and heat is discharged to the outside of the wearable electronic device 100 through the first space 231 and the first connection duct 531, this is merely an example. In another embodiment, external cold air may flow into the PBA 200 through the first space 231 and the first connection duct 531, and heat may be discharged to the outside of the wearable electronic device 100 through the second space 232 and the second connection duct 522.

According to another embodiment, the second support housing 130 may include an additional opening in addition to the first opening 511 and the second opening 512 shown in FIG. 5A. For example, the second support housing 130 may further include a first additional opening disposed on a portion adjacent to the first space 231, and the first additional opening may be connected with the first space 231 through a first additional connection duct. Accordingly, heat may be discharged to the outside through the first opening 511 and the first additional opening. In another example, the second support housing 130 may further include a second additional opening disposed on a portion adjacent to the second space 232, and the second additional opening may be connected with the second space 232 through a second additional connection duct. External air of the wearable electronic device 100 may flow into the inner space of the PBA 200 through the second opening 512 and the second additional opening. In another embodiment, the second support housing 130 may include a plurality of additional openings in addition to the first additional opening and/or the second additional opening, and, as described above, the plurality of additional openings may be connected to the first space 231 and/or the second space 232 through additional connection ducts corresponding thereto. Heat may be discharged to the outside through the plurality of additional openings. In another example, external air may flow into the PBA 200 through the plurality of additional openings.

Figure 5D:
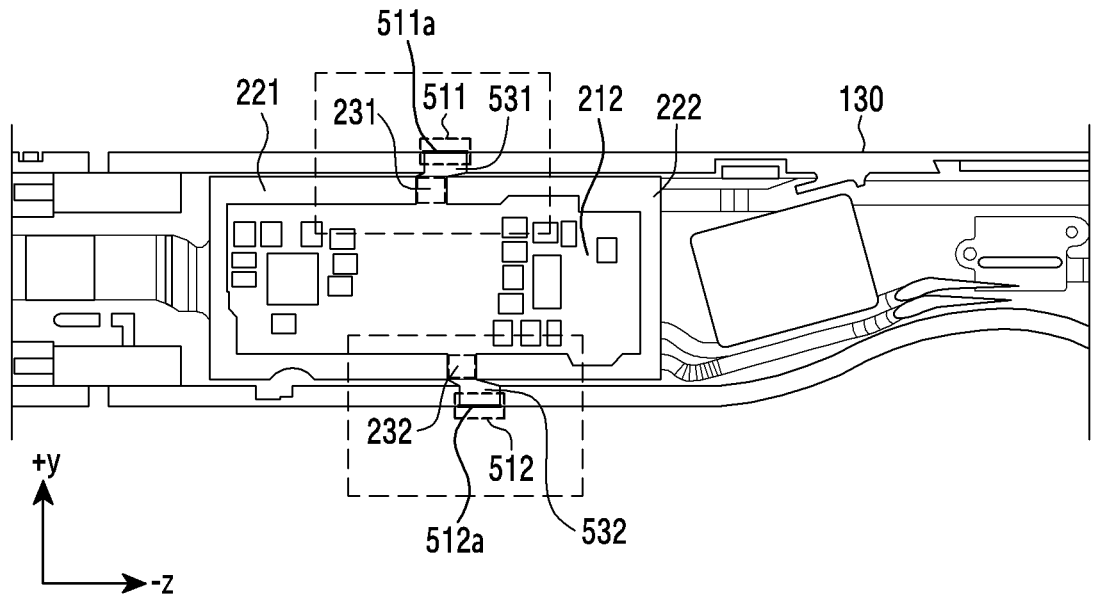
FIG. 5D is views illustrating the heat dissipation structure which includes in a heat blocking member added to the embodiment of FIG. 5A according to an embodiment.
Figure 5D:
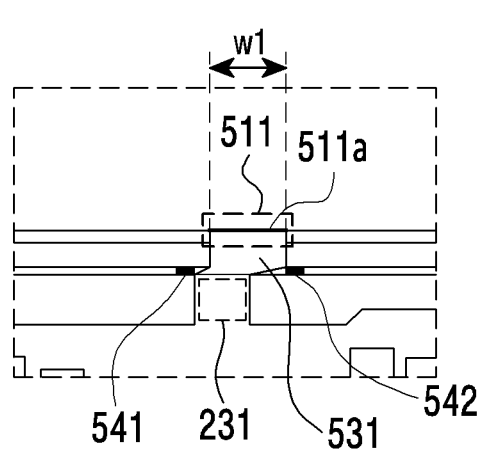
Figure 5D:
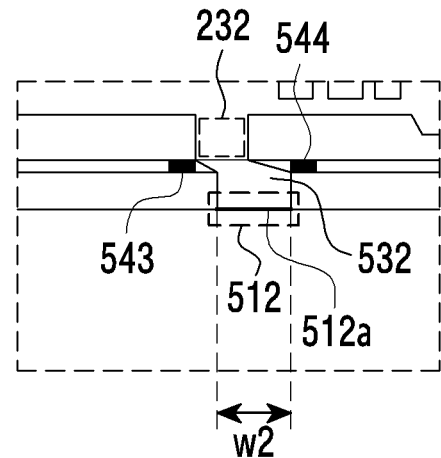

FIG. 5D is views illustrating a heat dissipation structure including a heat blocking member added to the embodiment of FIG. 5A according to an embodiment.

Referring to FIG. 5D, the wearable electronic device 100 according to an embodiment may include a heat blocking member 540. A first heat blocking member 541 and/or a second heat blocking member 542 of the heat blocking member 540 may be disposed on a side surface of the first connection duct 531. The first heat blocking member 541 and/or the second heat blocking member 542 may enhance heat dissipation efficiency by preventing heat from being transmitted to the side surface of the first connection duct 531 while the heat is being transmitted from the first space 231 to the first opening 511. In another example, a third heat blocking member 543 and/or a fourth heat blocking member 544 of the heat blocking member 540 may be disposed on a side surface of the second connection duct 532. The third heat blocking member 543 and/or the fourth heat blocking member 544 may enhance heat dissipation efficiency by preventing heat from being transmitted to the side surface of the second connection duct 532 while the heat is being transmitted from the second space 232 to the second opening 512.

According to an embodiment, external air of the second support housing 130 may flow into the PBA 200 through the second opening 512, the second connection duct 532, and the second space 232, and the drawn-in air may be discharged to the outside of the second support housing 130 through the first space 231, the first connection duct 531, and the first opening 511. Internal heat of the PBA 200 may be reduced due to the flow of the air.

Figure 6:
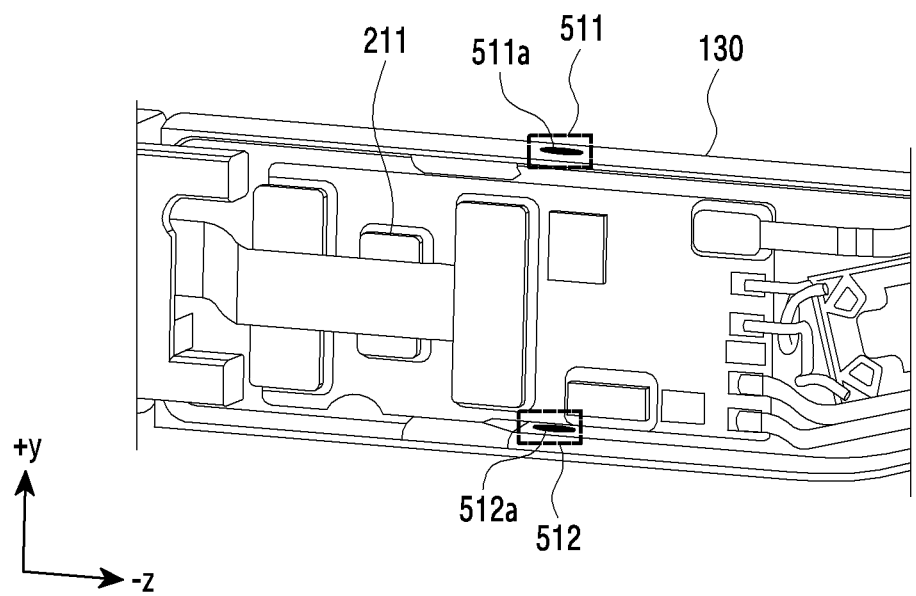
FIG. 6 is a view additionally illustrating a first PCB in the embodiment illustrated in FIG. 5.

FIG. 6 is a view additionally illustrating a first PCB in the embodiment illustrated in FIG. 5.

Referring to FIG. 6, the first PCB 211 included in the second support housing 130 is illustrated according to an embodiment. Compared to FIG. 5 which does not illustrate the first PCB 211 and illustrates the second PCB 212 and the interposer 220, FIG. 6 illustrates the first PCB 211 coupled with the interposer 220. Accordingly, the interposer 220 and/or the second PCB 212 may be obscured by the first PCB 211 in FIG. 6.

Figure 7:
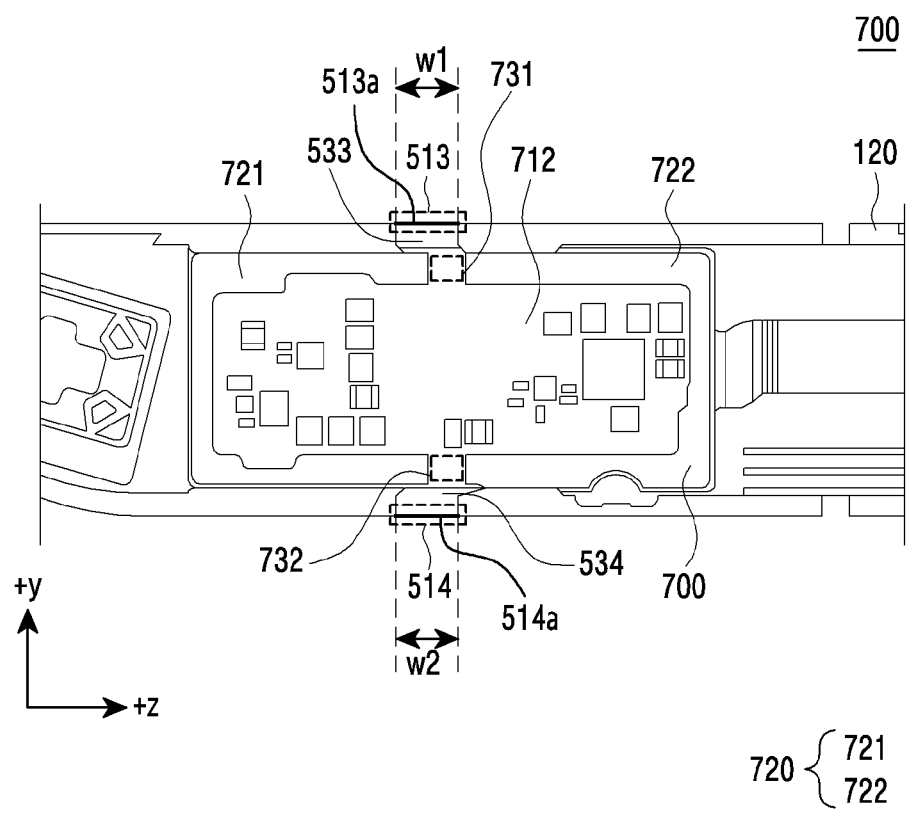
FIG. 7 is a view illustrating a heat dissipation structure through a space between a first interposer and a second interposer which are spaced apart from each other, and an opening of a second support housing.

FIG. 7 is a view illustrating a heat dissipation structure through an opening of a second support housing according to an embodiment.

According to an embodiment, a PBA 700 may be disposed in an inner space of the first support housing 120. The PBA 700 may include a first PCB (not shown), a second PCB 712, a first interposer 721, and/or a second interposer 722. In an embodiment, a first space 731 may be formed between a first end of the first interposer 721 and a second end of the second interposer 722, and a second space 732 may be formed between a third end of the first interposer 721 and a fourth end of the second interposer 722.

Descriptions of the PBA 200, the first PCB 211, the second PCB 212, the first interposer 221, the second interposer 222, the first space 231 and the second space 232 described in FIG. 2A may be applied to the PBA 700, the first PCB (not shown), the second PCB 712, the first interposer 721, the second interposer 722, the first space 731, and the second space 732 described in FIG. 7, respectively.

According to an embodiment, like the second support housing 130 shown in FIG. 5A, the first support housing 120 may include a third opening 513 disposed on a portion adjacent to the first space 731 within a specific distance, and the first support housing 120 may include a fourth opening 514 disposed on a portion adjacent to the second space 732 within a specific distance. In an embodiment, the third opening 513 may have a first width W1, and the fourth opening 514 may have a second width W2. For example, the first width W1 and the second width W2 may be the same as each other. In an embodiment, a porous material may be disposed in the third opening 513 and/or the fourth opening 514. For example, a third film 513a made of a porous material may be disposed in the third opening 513. In another example, a fourth film 514a made of a porous material may be disposed in the fourth opening 514. The third film 513a and/or the fourth film 514a made of the porous material may allow air to pass through, and may implement waterproofing and/or dustproofing by blocking water or dust from entering the wearable electronic device 100 from the outside.

According to an embodiment, the first space 731 may be connected with the third opening 513 through a third connection duct 533, and the second space 732 may be connected with the fourth opening 514 through a fourth connection duct 534. In an embodiment, heat generated by a plurality of electronic components (for example, the electronic component 310) disposed on the second PCB 212 may be transmitted to the outside through the third opening 513 and/or the fourth opening 514. For example, air in the PBA 700 that has a relatively high temperature due to heat may be discharged to the outside of the wearable electronic device 100 through the first space 731 and the third opening 513. In this case, air of the wearable electronic device 100 that has a relatively low temperature may flow into the interposer 220 through the second space 732 and the fourth opening 514. Accordingly, the wearable electronic device 100 may efficiently transmit internal heat to the outside of the wearable electronic device 100.

According to an embodiment, the PBA 700 in FIG. 7 is positioned in the first support housing 120, and the PBA 200 positioned in the second support housing 130 shown in FIGS. 5A and 5B may be different from each other at least in part. For example, at least one of the size of at least one space (for example, the first space 731 and the second space 732), a size of at least one opening (for example, the first opening 511, the second opening 512, the third opening 513, and the fourth opening 514) may be different according to the number and/or size of at least one electronic component (for example, the electronic component 310) positioned inside the PBA 700.

Figure 8A:
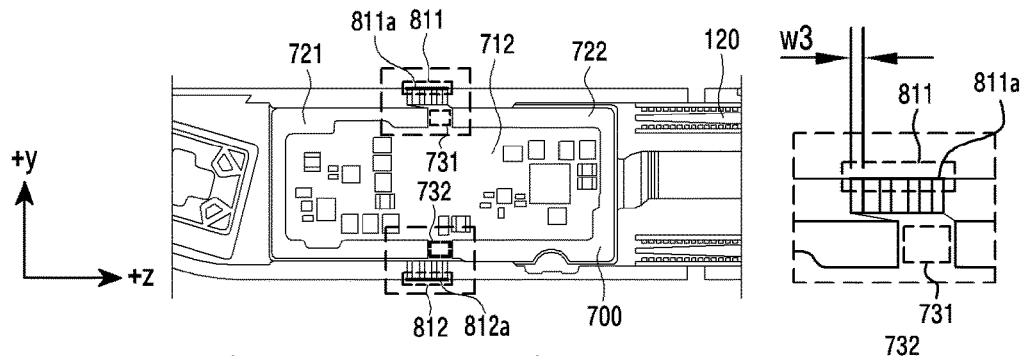
FIG. 8A is a view illustrating a first support housing including an opening of another form according to another embodiment.

FIG. 8A is a view illustrating a first support housing including an opening of another form according to another embodiment.

Figure 8B:
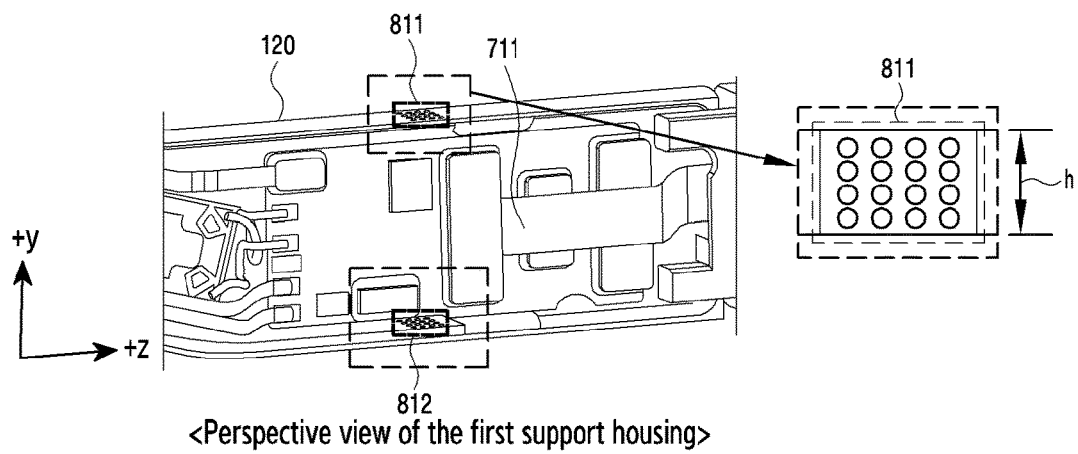
FIG. 8B is a perspective view of the first support housing 120.

FIG. 8B is a perspective view of the first support housing 120.

Figure 8C:
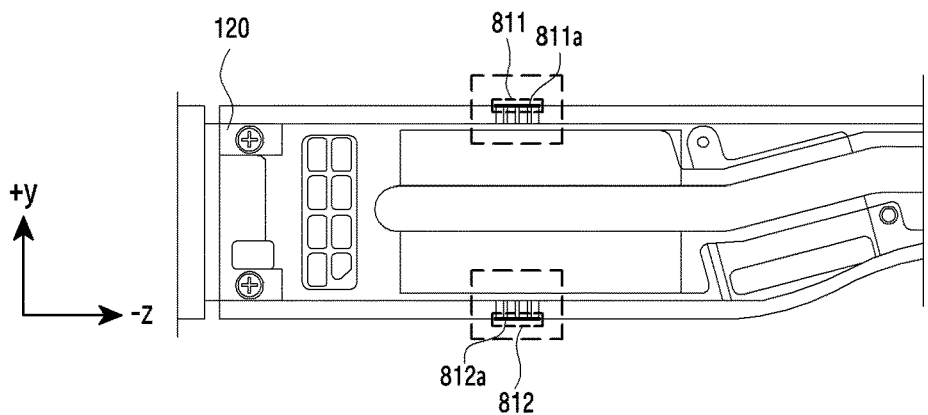
FIG. 8C is a view of the first support housing seen from the −x direction.

FIG. 8C is a view of the first support housing seen from the −x direction.

Referring to FIG. 8A, FIG. 8B and FIG. 8C, according to an embodiment, the first support housing 120 may include first openings 811 formed on a portion adjacent to a first space 731 of a PBA (for example, the PBA 700 of FIG. 7) within a specific distance. In the same way, the first support housing 120 may include second openings 812 formed on a portion adjacent to a second space 732 of the PBA 700 within a specific distance. In an embodiment, each of the first openings 811 may have a width (for example, a third width W3) smaller than the width of the first opening 511. In an embodiment, each of the second openings 812 may have a width (for example, a fourth width W4) smaller than the width of the second opening 512. For example, the third width W3 and the fourth width W4 may be the same as each other.

According to an embodiment, the height (h) of a portion of the first support housing 120 where the first openings 811 are formed may correspond to the height of the interposer 720, the first PCB 711 and/or the second PCB 712. For example, the height (h) of the first support housing 120 where the first openings 811 are formed may be substantially the same as the height of the interposer 720. In another example, the height (h) of the first support housing 120 where the first openings 811 are formed may be substantially the same as the coupling height of the interposer 720, the first PCB 711 and the second PCB 712.

According to an embodiment, a porous material may be disposed in the first openings 811 and/or the second openings 812. For example, a first film 811*a* made of a porous material may be disposed in the first openings 811. In another example, a second film 812*a* made of a porous material may be disposed in the second openings 812. The first film 811*a* and/or the second film 812*a* made of the porous material may allow air to pass through, and may implement waterproofing and/or dustproofing by preventing water or dust from entering the wearable electronic device 100 from the outside.

In an embodiment, heat generated by a plurality of electronic components (for example, the electronic component 310) disposed on the second PCB 712 may be transmitted to the outside through the first openings 811 and/or the second openings 812. For example, air in the interposer 720 that has a relatively high temperature due to heat may be discharged to the outside of the wearable electronic device 100 through the first space 731 and the first openings 811. In this case, air having a relatively low temperature may flow into the interposer 720 through the second space 732 and the second openings 812. Accordingly, the wearable electronic device 100 may efficiently transmit internal heat to the outside of the wearable electronic device 100.

Figure 9:
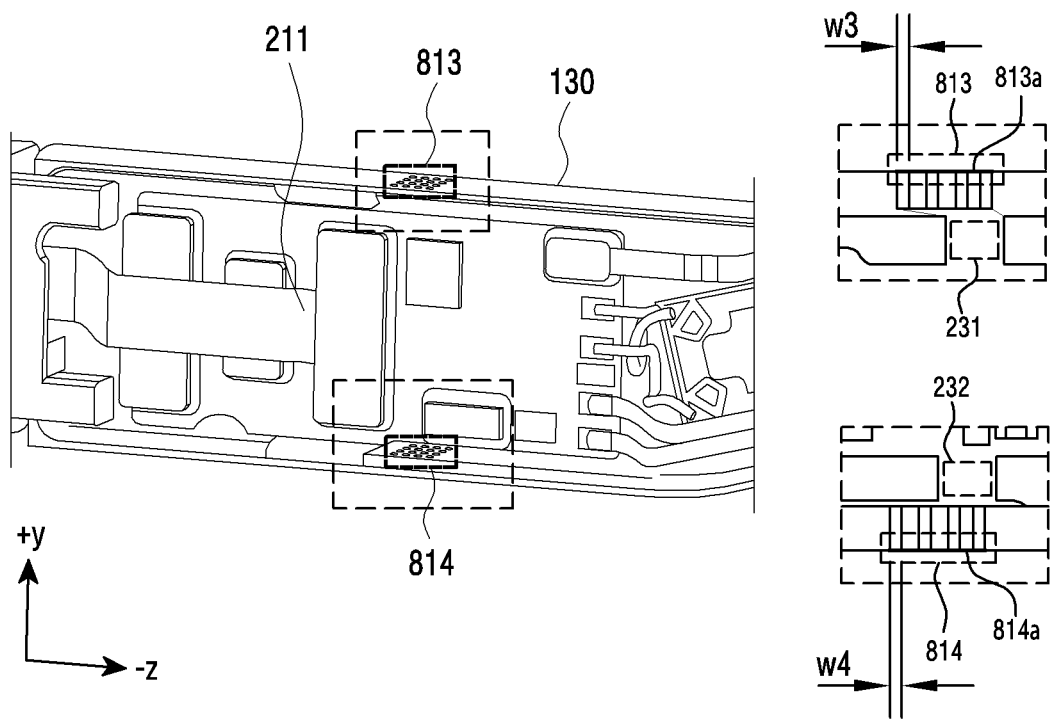
FIG. 9 is a view illustrating a second support housing including an opening according to another embodiment.

FIG. 9 is a view illustrating a second support housing including an opening according to another embodiment.

According to an embodiment, a PBA (for example, the PBA 200 of FIG. 2A) may be disposed in the second support housing 130. The second support housing 130 may include third openings 813 formed on a portion adjacent to a first space 231 of the PBA 200 within a specific distance. In the same way, the second support housing 130 may include fourth openings 814 formed on a portion adjacent to a second space 232 within a specific distance. In an embodiment, each of the third openings 813 may have a width (for example, the third width W3) smaller than the width of the first opening 511. In the same way, each of the fourth openings 814 may have a width (for example, the fourth width W4) smaller than the width of the second opening 512. For example, the third width W3 and the fourth width W4 may be the same as each other.

According to an embodiment, a porous material may be disposed in the third openings 813 and/or the fourth openings 814. For example, a third film 813*a* made of a porous material may be disposed in the third openings 813. In another example, a fourth film 814*a* made of a porous material may be disposed in the fourth openings 814. The third film 813*a* and/or the fourth film 814*a* formed with the porous material may allow air to pass through, and may implement waterproofing and/or dustproofing by preventing water or dust from entering the wearable electronic device 100 from the outside.

According to an embodiment, the method for transmitting internal heat of the wearable electronic device 100 to the outside through the third openings 813 and/or the fourth openings 814 is the same as the method described in FIG. 9, and thus will not be described.

Figure 10:
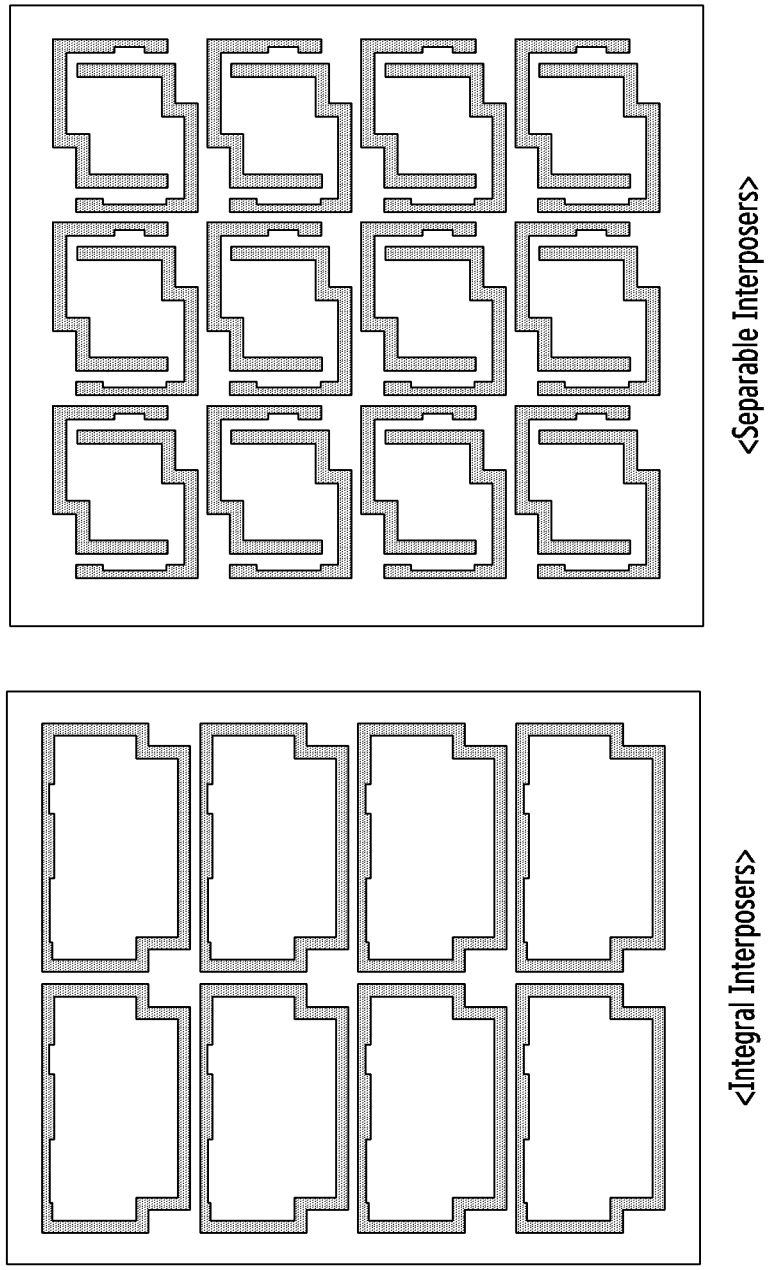
FIG. 10 is views comparing the number of manufactured integrated interposers and the number of manufactured separable interposers in a particular area according to an embodiment.

FIG. 10 is views comparing the number of manufactured integrated interposers and the number of manufactured separable interposers in a particular area.

Referring to FIG. 10, in the case of the integrated interposers, 8 interposers may be manufactured per designated area.

According to an embodiment, in the case of the separable interposers, 12 interposers may be manufactured per designated area. Accordingly, when using separable interposers, more interposers may be manufactured per the same area than in the case of the integrated interposers.

Hereinafter, an electronic device 1101 described below may refer to the wearable electronic device 100.

Figure 11:
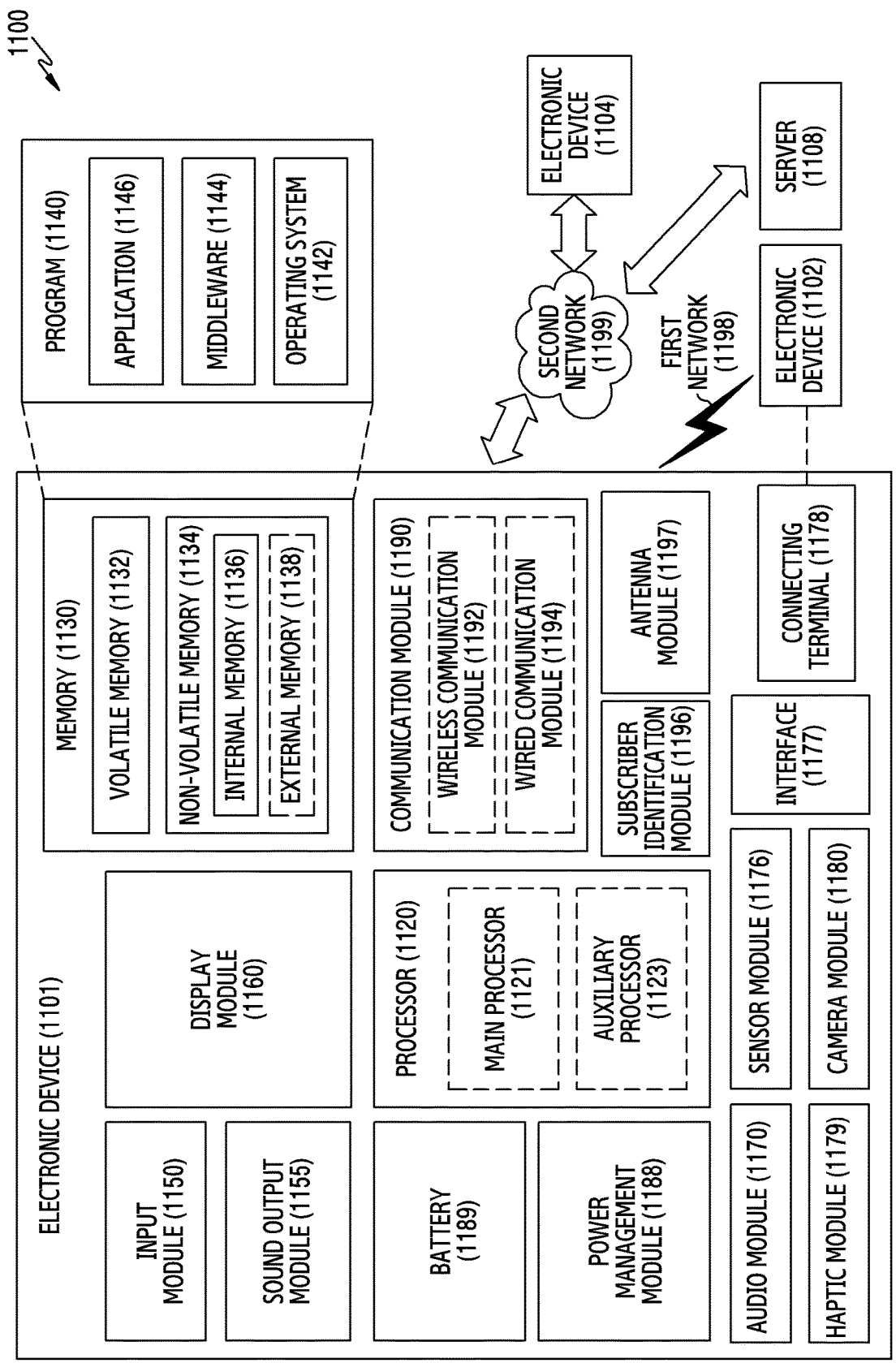
FIG. 11 is a block diagram of an electronic device in a network environment according to various embodiments.

FIG. 11 is a block diagram illustrating an electronic device 1101 in a network environment 1100 according to an embodiment. Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In some embodiments, at least one of the components (e.g., the connecting terminal 1178) may be omitted from the electronic device 1101, or one or more other components may be added in the electronic device 1101. In some embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to certain embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In another embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

A wearable electronic device 100 according to an embodiment may include a main housing 110, a first printed circuit board (PCB) 211, a second PCB 212 disposed in parallel with the first PCB 211, a first interposer 221, and a second interposer 222, and the housing 110 may include at least one first opening 511 formed on a first portion thereof, and the first interposer 221 and the second interposer 222 may be disposed between the first PCB 211 and the second PCB 212, the first interposer 221 and the second interposer 222 may be disposed to have a first end 221a of the first interposer 221 and a second end 222a of the second interposer 222, which faces the first end 221a, spaced apart from each other by a first designated distance or longer, and a first space 231 between the first end 221a and the second end 222a may be connected to the at least one first opening 511 of the main housing 110.

According to an embodiment, the wearable electronic device 100 may further include a first connection duct 531 to connect the first space 231 and the at least one first opening 511.

According to an embodiment, the wearable electronic device 100 may further include a first heat blocking member 541 and a second heat blocking member 542 disposed on a side surface of the first connection duct 531.

According to an embodiment, the main housing 110 may include first openings 811 formed on the first portion and having a second width W2.

According to an embodiment, the main housing 110 may include a first opening 511 formed on the first portion and having a first width W1.

According to an embodiment, a third end 221b of the first interposer 221 may be disposed to be spaced apart from a fourth end 222b of the second interposer 222, which faces the third end 221b, by a second designated distance or longer, and a second space 232 may be formed between the third end 221b and the fourth end 222b.

According to an embodiment, the main housing 110 may further include at least one second opening 512 formed on a second portion thereof.

According to an embodiment, the wearable electronic device 100 may further include a second connection duct 532 to connect the second space 232 and the at least one second opening 512.

According to an embodiment, the wearable electronic device 100 may further include at least one electronic component 310 disposed on the first PCB 211, and a shielding member 321 disposed adjacent to the first PCB 211.

According to an embodiment, the wearable electronic device 100 may further include a thermal transfer member 322 disposed between the at least one electronic component 310 and the shielding member 321.

According to an embodiment, the wearable electronic device 100 may further include a thermal spreader 324 disposed adjacent to the first PCB 211.

According to an embodiment, the wearable electronic device 100 may further include a heat dissipation sheet 323 disposed adjacent to the first PCB 211.

According to an embodiment, the wearable electronic device 100 may further include a heat dissipation plate disposed adjacent to the first PCB 211.

According to an embodiment, the wearable electronic device 100 may further include a film 511a disposed in the at least one first opening 511 and formed with a porous material.

According to an embodiment, the wearable electronic device 100 may further include a third PCB 213 disposed in parallel with the second PCB 212, and may further include a third interposer 241 and a fourth interposer 242, and the third interposer 241 and the fourth interposer 242 may be disposed between the second PCB 212 and the third PCB 213, and the third interposer 241 and the fourth interposer 424 may be disposed to have a fifth end of the third interposer 241 and a sixth end of the fourth interposer 242, which faces the fifth end, spaced apart from each other by a third designated distance or longer.

According to an embodiment, a wearable electronic device 100 may include a first PCB 211, a second PCB 212 disposed in parallel with the first PCB 211, a first interposer 221 and a second interposer 222, the first interposer 221 and the second interposer 222 may be disposed between the first PCB 211 and the second PCB 212, the first interposer 221 and the second interposer 222 may be disposed to have a first end 221a of the first interposer 221 and a second end 222a of the second interposer 222, which faces the first end 221a, spaced apart from each other by a first designated distance or longer, and wherein a third end 221b of the first interposer 221 may be disposed to be spaced apart from a fourth end 222b of the second interposer 222, which faces the third end 221b of the first interposer 221, by a second designated distance or longer.

According to an embodiment, the wearable electronic device 100 may further include a main housing 110 forming an exterior of the wearable electronic device 100, the main housing 110 may include at least one first opening 511 formed on a first portion adjacent to a first space 231 between the first end 221a and the second end 222a; and at least one second opening 512 formed on a second portion adjacent to a second space 232 between the third end and the fourth end.

According to an embodiment, the wearable electronic device 100 may further include at least one electronic component 310 disposed on the first PCB 211, and a shielding member 321 disposed adjacent to the first PCB 211.

According to an embodiment, the wearable electronic device 100 may further include a thermal transfer member 322 disposed between the at least one electronic component 310 and the shielding member 321.

According to an embodiment, the wearable electronic device 100 may further include a thermal spreader 324, and the thermal spreader 324 may be disposed adjacent to the first PCB 211.

The electronic device according to certain embodiments disclosed in the present document may be devices of various types. The electronic device may include, for example, a portable communication device (for example, a smartphone), a computer device, a portable multimedia device, a portable medical device, a camera, a wearable device, or a home appliance. The electronic device according to embodiments of the present document is not limited to the above-mentioned devices.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A wearable electronic device comprising:
   a housing including a first portion in which at least one first opening and a first connection duct are formed;
   a first printed circuit board (PCB);
   a second PCB disposed in parallel with the first PCB;
   a first interposer; and
   a second interposer,
   wherein the first interposer and the second interposer are disposed between the first PCB and the second PCB,
   wherein a first end of the first interposer and a second end of the second interposer facing the first end are spaced apart by a first designated distance, and
   wherein a first space between the first end and the second end is connected to the at least one first opening of the housing via the first connection duct.

2. The wearable electronic device of claim 1, further comprising:
   a member for blocking heat,
      wherein the member is disposed on a side face of the first connection duct.

3. The wearable electronic device of claim 1, wherein the at least one first opening includes a plurality of openings formed in the first portion and having a first width.

4. The wearable electronic device of claim 1, wherein the at least one first opening includes one opening formed in the first portion and having a second width.

5. The wearable electronic device of claim 1, wherein a third end of the first interposer is disposed to be spaced apart from a fourth end of the second interposer facing the third end by a second designated distance, and
   wherein a second space is disposed between the third end and the fourth end.

6. The wearable electronic device of claim 5, wherein the housing further includes a second portion in which at least one second opening is formed.

7. The wearable electronic device of claim 6, wherein a second connection duct for connecting the second space and the at least one second opening is formed in the second portion.

8. The wearable electronic device of claim 1, further comprising:
   at least one electronic component disposed on the first PCB; and
   a shielding member disposed adjacent to the first PCB.

9. The wearable electronic device of claim 8, further comprising a thermal transfer member disposed between the at least one electronic component and the shielding member.

10. The wearable electronic device of claim 1, further comprising a thermal spreader disposed adjacent to the first PCB.

11. The wearable electronic device of claim 1, further comprising a heat dissipation sheet disposed adjacent to the first PCB.

12. The wearable electronic device of claim 1, further comprising a heat dissipation plate disposed adjacent to the first PCB.

13. The wearable electronic device of claim 1, further comprising a porous material disposed in the at least one first opening.

14. The wearable electronic device of claim 1, further comprising:
   a third PCB disposed in parallel with the second PCB;
   a third interposer; and
   a fourth interposer,
      wherein the third interposer and the fourth interposer are disposed between the second PCB and the third PCB, and
      wherein a fifth end of the third interposer and a sixth end of the fourth interposer facing the fifth end are spaced apart by a third designated distance.

15. A wearable electronic device comprising:
   a housing forming an exterior of the wearable electronic device, wherein the housing includes a first portion in which at least one first opening and a first connection duct are formed and a second portion in which at least one second opening is formed;
   a first printed circuit board (PCB);
   a second PCB disposed in parallel with the first PCB;
   a first interposer; and
   a second interposer,
      wherein the first interposer and the second interposer are disposed between the first PCB and the second PCB,
      wherein a first end of the first interposer and a second end of the second interposer facing the first end are spaced apart by a first designated distance,
      wherein a third end of the first interposer and a fourth end of the second interposer facing the third end are spaced apart by a second designated distance,
      wherein the first portion in which the at least one first opening is formed is adjacent to a first space between the first end and the second end,
      wherein the second portion in which the at least one second opening is formed is adjacent to a second space between the third end and the fourth end, and
      wherein the first space is connected to the at least one first opening via the first connection duct.

16. The wearable electronic device of claim 15, further comprising:
   at least one electronic component disposed on the first PCB; and
   a shielding member disposed adjacent to the first PCB.

17. The wearable electronic device of claim 16, further comprising a thermal transfer member disposed between the at least one electronic component and the shielding member.

18. The wearable electronic device of claim 15, further comprising a thermal spreader,
   wherein the thermal spreader is disposed adjacent to the first PCB.

* * * * *